US005391835A

United States Patent [19]

Yao et al.

[11] Patent Number: 5,391,835

[45] Date of Patent: Feb. 21, 1995

[54] EXPLOSION RESISTANT, OIL INSULATED, CURRENT TRANSFORMER

[75] Inventors: Eugene Y. G. Yao, Toronto; Arthur K. K. Leung, Oakville, both of Canada

[73] Assignee: BBA Canada Limited, Scarborough, Canada

[21] Appl. No.: 804,921

[22] Filed: Dec. 11, 1991

[51] Int. Cl.[6] ...................... H01F 27/02; H01F 27/06; H01F 40/06; H05K 5/02

[52] U.S. Cl. ................................ 174/18; 174/17 LF; 336/92; 439/559

[58] Field of Search ........... 174/17 R, 17 LF, 17 GF, 174/17.06, 18; 439/198, 363, 559; 336/92–94, 173, 174, 175

[56] References Cited

U.S. PATENT DOCUMENTS

| | | | |
|---|---|---|---|
| 2,504,647 | 4/1950 | Camilli | 336/92 |
| 2,529,135 | 11/1950 | Camilli | 336/92 |
| 2,703,390 | 3/1955 | Marks | 336/92 |
| 3,380,009 | 4/1968 | Miller | 336/92 |
| 3,792,397 | 2/1974 | Reinemann | 336/92 |
| 3,955,871 | 5/1976 | Kruger | 439/363 X |
| 4,054,351 | 10/1977 | Gallay et al. | 439/198 |
| 4,054,856 | 10/1977 | Linscott, Jr. | 336/92 X |
| 4,231,631 | 11/1980 | Guerinault et al. | 439/559 |

FOREIGN PATENT DOCUMENTS

| | | | |
|---|---|---|---|
| 316416 | 8/1929 | United Kingdom | 174/18 |
| 346604 | 4/1931 | United Kingdom | 174/18 |
| 1150876 | 5/1969 | United Kingdom | 439/363 |

OTHER PUBLICATIONS

Trench Electric Bulletin 500–05 May 1983 "Current Transformers".

"Cover Bushings on L–M Round-Wound Transformers" Alvin Coyle, Electrical World, May 26, 1952, p. 25.

*Primary Examiner*—Peter Dungba Vo
*Attorney, Agent, or Firm*—Stanley E. Johnson

[57] ABSTRACT

A head type current transformer having an aluminum head housing mounted on top of and supported by a porcelain insulator. The head housing and insulator together define an enclosure housing therein an, insulated, electrical component immersed in a liquid dielectric. The transformer unit is rendered explosion resistant by having a shock wave attenuator located at least partially in the liquid in the vicinity of the juncture of the housing and insulator to reduce the force of a shock wave originating in the head housing below that which would cause fracturing of the porcelain insulator. A selected area of the wall of the head housing is also patterned to facilitate its rupture in a predetermined area which is in the region of the highest voltage stress area. A filler material of felt is also used to displace a portion of the oil dielectric at the area of weakness.

18 Claims, 5 Drawing Sheets

EXPLOSION RESISTANT, OIL INSULATED, CURRENT TRANSFORMER

FIELD OF INVENTION

This invention relates to electric induction apparatus and more particularly to improvements rendering liquid filled current transformers explosion resistant.

Current transformers commonly used are of two general types one being referred to as the inverted type and the other an eye bolt or hairpin type. The present invention is particularly concerned with the inverted type. The transformers are kraft paper/mineral oil insulated free-standing and utilized in transmission networks and in utility-industrial operations for the purpose of protective relaying and metering applications.

In the past many different types of free-standing oil insulated current transformers have been utilized and while they have proven satisfactory and exhibited a reliable service for the users there results substantial damage when failure does occur. If and when there is an internal arc, failure follows which is of an explosive nature that is followed by a fire, the latter being fed by the escaping mineral oil. The results of such failure can be hazardous to the nearby personnel and extremely damaging to surrounding equipment. Failure of a current transformer involves an electric arc that is of extremely high temperature. This high temperature decomposes the paper and oil generating highly combustible gases with an instantaneous volume increase of many orders of magnitude. The insulating oil is a transmission medium for the shock wave. The current transformers of the type in question have a metal head housing mounted on top of a porcelain insulator and together they provide an enclosure for the electrical active part. During the explosion the porcelain insulator is normally blown apart as is also in many cases the head housing. The shattered insulator becomes many high velocity projectiles that cause considerable damage.

A number of explosive failures occurring among the conventional oil filled units has raised the concerns of the electric power utility companies and some are beginning to specify a new acceptance test. It is or will soon become necessary to demonstrate, in the event of an internal fault, that the explosion will be limited to the head area. Simulation tests have been performed by the applicant herein in a special high power test laboratory and it has been demonstrated that with the present invention, to be described hereinafter, the porcelain will remain unshattered following an explosion resulting from a fault.

Searches undertaken by the applicant herein for explosion resistant transformers uncovered U.S. Pat. Nos. 2,504,647 and 2,529,135 issued respectively Apr. 18, 1950 and Nov. 7, 1950 to G. Camilli and U.S. Pat. No. 2,703,390 issued Mar. 1, 1955 to L. W. Marks. Camilli '647 discloses a high voltage current transformer of general interest and Camilli '135 discloses means for relieving pressure within the casing. This Camilli structure is of the eye bolt or hair pin type referred to hereinbefore as is also the transformer disclosed by Marks. In both of these the metal housing serves as the support for the structure and the porcelain insulator is mounted on top of the metal housing. The housing is at ground potential.

The metal tank or housing is provided with an area of weakness such as a diaphragm or grooves in the casing that will rupture at a predetermined pressure below the pressure which would cause shattering of the cylindrical porcelain insulator. One of the drawbacks of this equipment is that when the housing ruptures it no longer can support the insulator mounted thereon and therefore may fall over causing more damage.

The aforementioned Marks U.S. Pat. No. 2,703,390 also discloses utilizing an inert filler material in the metal tank to displace some of the dielectric liquid such as oil. Neither the sand filler nor the rupturing of the casing address the concern of damage by a shockwave that occurs during an explosion. The sand filler material being solid will transmit the shock wave with full force to all parts of the apparatus that it contacts.

SUMMARY OF THE INVENTION

A principal object of the present invention is to attenuate the pressure waves resulting from internal arcing so as to avoid the risk of porcelain explosion. A more specific object is to limit the pressure waves generated from the internal arcing to the head of the current transformer and thereby provide a predetermined area for the explosion should one occur.

A further principal object of the present invention is to minimize the transfer of force from the head housing towards the porcelain so that the destructive force of the wave terminates at the head housing.

A further principal object of the present invention is to provide a head housing where, upon failure, internal projectiles may be prevented from mechanically damaging the porcelain housing.

In accordance with the present invention there is broadly provided a high voltage current transformer that includes an energy absorbing shock wave attenuator in the vicinity of the juncture between the porcelain insulator and the head housing and located at least partially within the chamber that receives the electrical active part of the transformer.

According to another aspect of the invention lines of weakness are provided in the head housing at a position in the vicinity of dielectrically the weakest point where arcing is most likely to take place when it occurs.

In accordance with another aspect of the invention the shock wave attenuator is also located in the vicinity of dielectrically the weakest point and slightly downstream therefrom in a direction away from the head housing toward the porcelain insulator.

In accordance with a further aspect of the invention a filler material is utilized in the vicinity of dielectrically the weakest point to displace the oil from such area minimizing damage from an explosion when a fault occurs.

With the explosion resistant current transformer of the present invention the risk of explosion in the event of an internal arc occurring in the high stress area within the head housing results in a much lower transfer of mechanical forces to the porcelain. The shock wave attenuator acts as an excellent dampening mechanism for the resulting shock wave. The overall effect is that failure will be limited to the head housing of the current transformer and projectiles cannot mechanically damage the porcelain housing and there are no external high velocity projectiles to damage surrounding equipment or injure personnel that are present.

LIST OF DRAWINGS

The invention is illustrated by way of example in the accompanying drawings wherein.

DESCRIPTION OF PREFERRED EMBODIMENT

Figure 1:
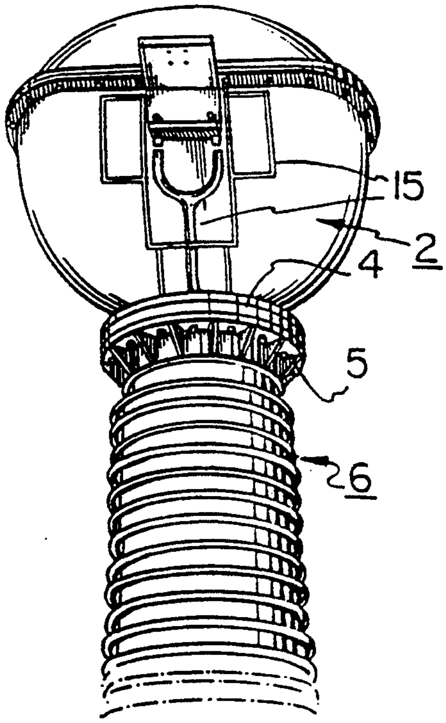
FIG. 1 is a vertical elevational view of a head type current transformer incorporating improvements provided in accordance with the present invention.

Illustrated in the drawings is a high voltage "head type" current transformer where a primary conductor assembly 1 passes horizontally through an aluminum head housing 2 mounted on top of and supported by a porcelain insulator 6. The aluminum head housing 2 has a flange 2A connected to a flange 6A of the porcelain insulator by means of a plurality of nut and bolt units 5. This is the conventional attachment of the head housing to the insulator. In accordance with the present invention there is a shock wave attenuator that includes a portion within the housing and is anchored to the rigid structure. This anchoring in the preferred form, includes a resilient part interposed between the flanges 2A and 6A.

Figure 2:
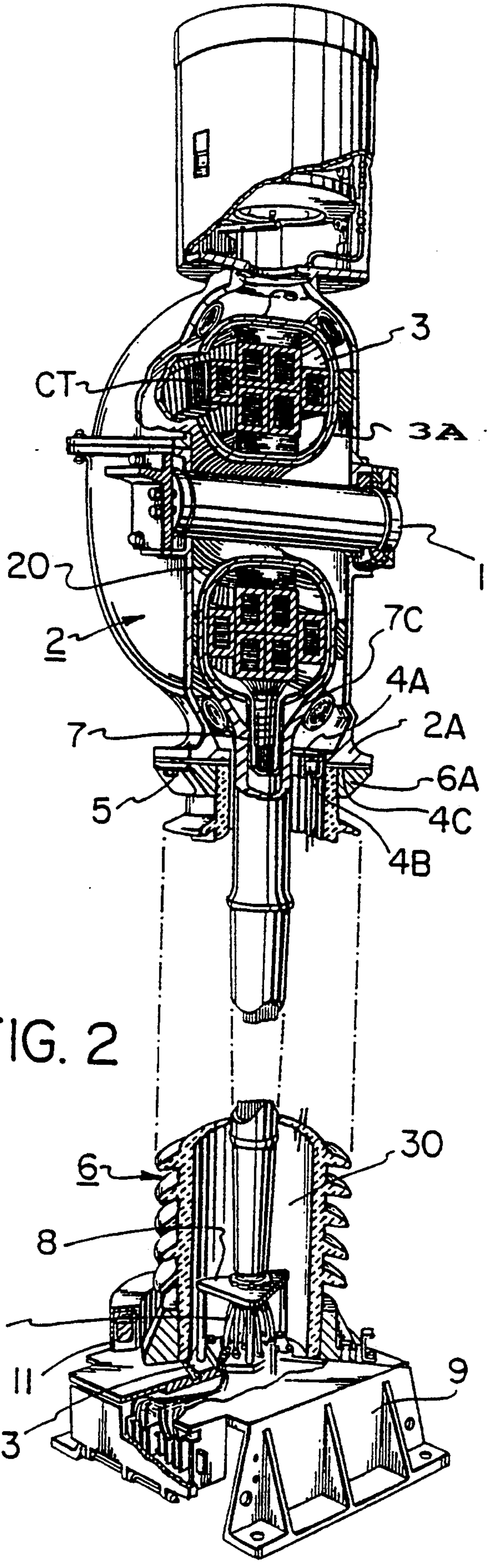
FIG. 2 is a sectioned perspective view of a current transformer of the present invention.
Figure 3:
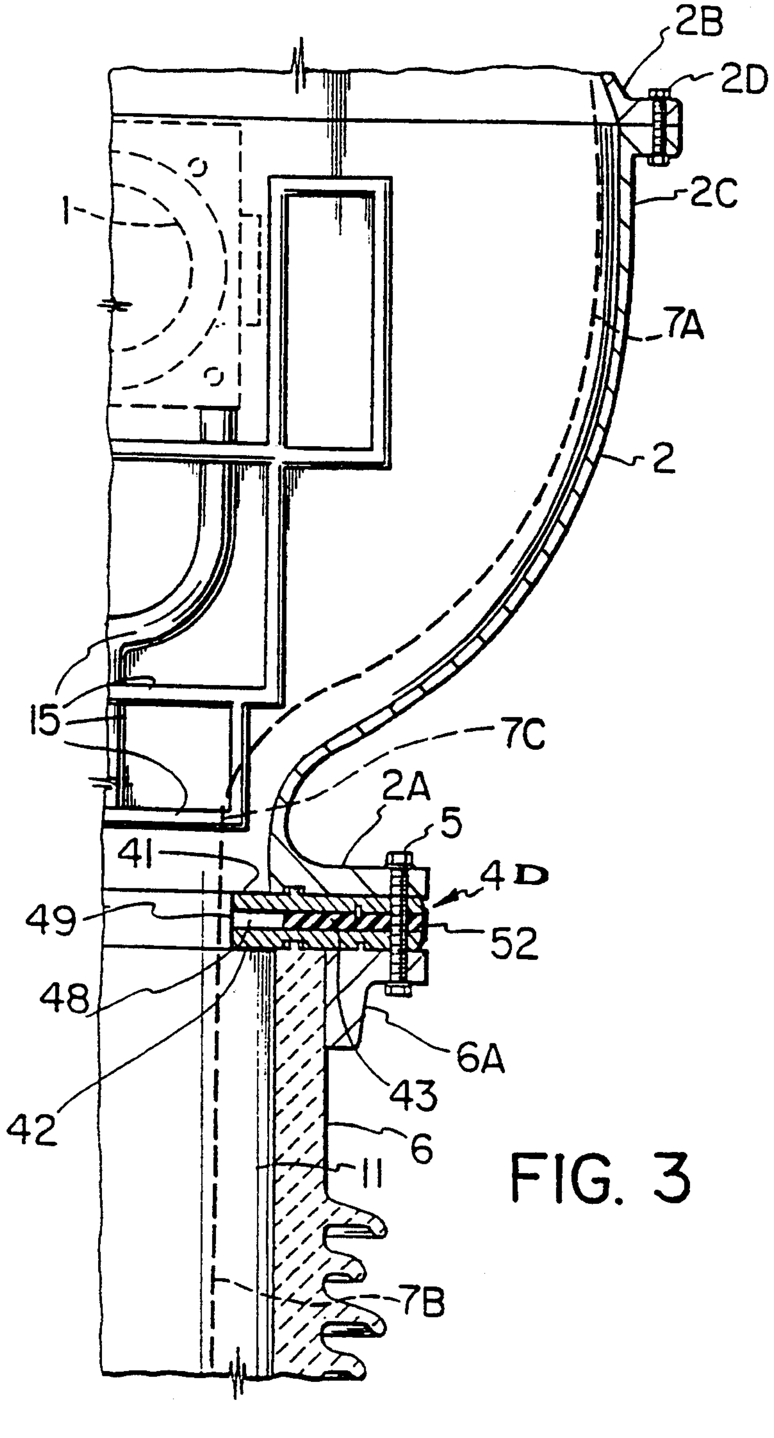
FIG. 3 is a partial vertical cross-sectional view of the current transformer shown in FIG. 1.

The head housing 2 is a shell casing providing an internal chamber 20 and the porcelain insulator is a cylindrical sleeve providing a further chamber 30. These chambers together form an enclosure surrounding an electrical, insulated component illustrated by broken line in FIG. 3 and which has an upper insulated part 7A, a lower insulated part 7B and an insulated neck part designated 7C. The component parts 7A, 7B and 7C are well known in the art and are more detailed in FIG. 2. Referring to FIGS. 2 and 3, the upper part 7A has annular transformer cores CT located in an aluminum core housing 3 which is covered with primary insulation 3A. This primary insulation is multi layers of kraft paper. A bushing tube 7 extends downwardly from the core housing 3 and is attached at its lower end to a support stand 8. The insulator 6 rests on a ground pad 9. The secondary leads designated 10 pass through the stem part 7B which also is insulated with multi layers of kraft paper. An oil to air seal block 13 closes the bottom end of the shell type insulator 6.

Optionally a ground fault transformer 11 may be provided as well as an optional capacitance tap (not shown). During construction upper annular part 7A and the lower or stem part 7B with the kraft insulation are machine wound providing uniformity and consistency to the insulation. The neck part 7C on the other hand is insulated by hand and therefore more prone to variance in configuration and furthermore is in a high stress voltage area where a fault is more likely to occur. The coil windings in the enclosure are conventional in the art and the insulative covering of the core housing and the stem is known in the art as the electrical active part.

The insulation as well as the maximum voltage stress area provides a predetermined location, for arcing to occur should there be a fault. The most vulnerable area is the neck area because of manufacturing variances. It is known that a few will fail in time and a principle aim of the present invention is to confine the explosion to a particular area by various means and combinations thereof.

In accordance with the present invention a shock wave attenuator is located in the vicinity of the junction of the head housing 2 and the insulator 6. Another feature of the present invention is the provision of grooves in a wall or walls of the head housing to facilitate rupture of the head housing in a selected area should a fault occur. Another feature of the present invention is the use of filler material which displaces the oil dielectric at the area of dielectric weakness. These features may be employed in various combinations and subcombinations thereof to render the transformer explosion resistant.

In extra high voltage units the paper insulation in the neck area 7C of the active component will have a thickness of a few inches. This high voltage stress area is where arcing will occur if there is a failure. The arcing, resulting from a break-down of internal insulation of the active part, has the result of a significant amount of energy being released. This causes a rapid break-down of the insulation materials and the gas pressure within the structure rises rapidly.

The arrangement of pressure relief grooves 15 at a location in the vicinity of the high stress area, i.e., in the region of neck part 7C provides a predetermined location for the explosion.

In accordance with a further aspect of the present invention the interior of the casing at this high stress area has pieces of felt therein variously positioned and layered one upon another as illustrated in FIGS. 5 to 11 and which will be described in more detail hereinafter. The build-up of layers of felt pieces in the neck area displaces some oil insulation which fills the space between the active part and the chamber defined by the interior of the head housing and porcelain insulator.

As previously mentioned the shock wave attenuator is located in proximity of the high stress area and has a portion that projects into the chamber towards the insulated stem 7B of the active component. The space between the shock wave attenuator and the active part should be relatively small without touching. As will be seen hereinafter this inwardly projecting portion is provided with a sealed air chamber permitting the attenuator to deform in response to a shock wave so as to attenuate the same reducing the force to an extent so as to avoid fragmentation of the porcelain insulator.

Referring first to FIG. 2 there is illustrated a shock wave attenuator 4A having an air tight chamber 4B located in the liquid dielectric at the juncture of chambers 20 and 30. The attenuator 4A includes an outer flange 4C which is clamped between flanges 2A and 6A thereby anchoring the attenuator to the rigid structure. Flange 4C is preferably of a shock wave absorbing type of material.

Figure 4:
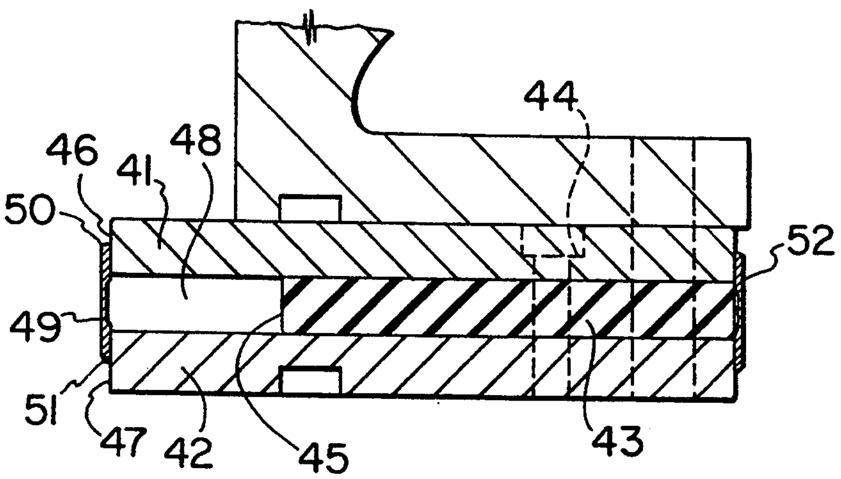
FIG. 4 is an enlargement of the shock wave attenuator shown in FIG. 1 interposed between the head housing and the porcelain insulator.

A particular shock wave attenuator 4D is illustrated in an enlarged partial cross-section in FIGS. 3 and 4 and includes an upper annular flange 41, a lower annular flange 42 and an annular rubber ring 43 interposed therebetween. The flanges 41 and 42 are joined together by a plurality of studs 44 torqued sufficiently to provide a predetermined compression of the rubber annular ring 43. The diameter of the inner surface 45 of the rubber annular ring 43 is substantially greater than the inner diameter of the inner surfaces 46 and 47 of the respective upper and lower flanges. This difference in diameters provides an energy absorbing chamber 48 sealingly closed by a stainless steel band 49 welded with a continuous weld at each of its marginal edges 50 and 51 to the respective upper and lower stainless steel flanges 41 and 42. Chamber 48 is a sealed air chamber. A second stainless steel band 52 circumscribes the outer edges of flanges 41 and 42 and is spot welded thereto providing a weather barrier protecting the outer edge of the rubber annular ring 43.

A shock wave striking, for example, upper plate 41 deforms such plate portion that projects into the casing and this deflection is absorbed by the compressible fluid in chamber 48. The force of the wave is thus sheltered from flange 42 to the extent that the wave which continues on into the fluid in chamber 11 does not have sufficient force to cause the porcelain insulator to shatter.

In substance the portion of the shock wave attenuator in the housing is a compressible shock absorber means. This shock absorber is in the fluid at the juncture of chambers 20 and 30 so that a shock wave in the dielectric fluid in chamber 20 is not of the same damaging force when it reaches the chamber 30. This protects the insulator preventing it from being shattered.

As previously mentioned there are pieces of felt placed in the head housing chair in proximity of the region of weakest point, i.e., the area in which an arc is likely to occur should failure of a transformer take place.

Figure 5:
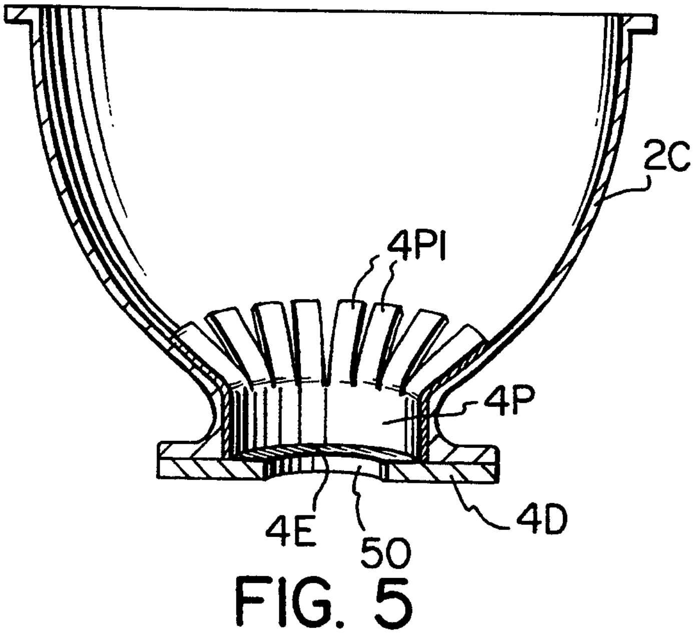
FIGS. 5 to 8 are partial sectional views in the same plane as FIG. 3 illustrating placement of discrete pieces of filler material in the head housing to displace the liquid dielectric.

In FIG. 5 there is illustrated a first piece of felt 4P that fits into the neck portion of the aluminum head housing in the vicinity of the flange 2A and projecting upwardly therefrom. Felt piece 4P is a short cylindrical sleeve with slits extending inwardly from one end that provides a series of fingers 4P1. Incidentally FIGS. 5 to 11 also illustrate a shock wave attenuator designated 4D and located below the flange 2A. The shock wave attenuator 4D has a central aperture 50 corresponding to a diameter of band 49 illustrated in FIGS. 3 and 14. This aperture 50 can readily be made of various sizes to accommodate different capacity transformer units (also being of different physical size) within a casing and porcelain insulator base common in size to all of the different capacity units.

The shock wave attenuator 4D has, as in FIG. 3, a portion 4E that effectively is immersed in the dielectric, i.e., oil in the chamber and it is this portion 4E which can be appropriately designed to absorb shock waves reducing the force of the shock wave in the fluid below that which would cause damage to the insulator when the shock wave reaches chamber 30.

Figure 6:
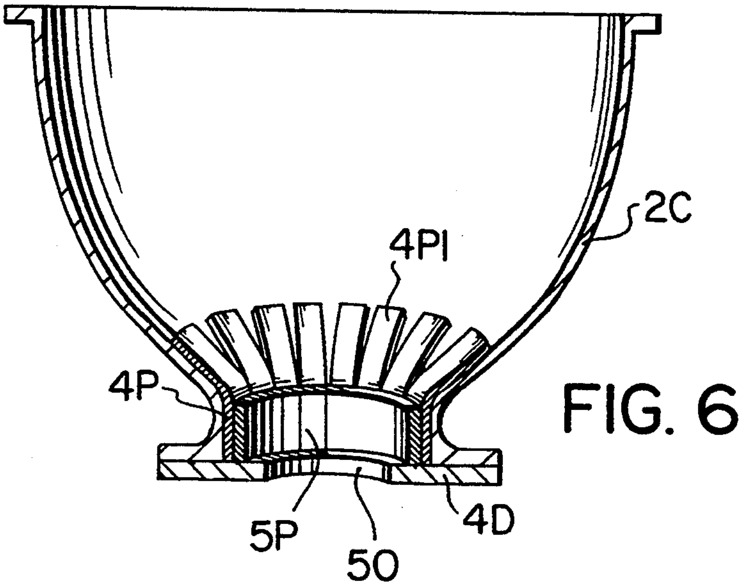

FIG. 6 illustrates a second piece of felt 5P placed in the neck portion overlying the cylindrical sleeve portion of felt piece 4P illustrated in FIG. 5. Felt piece 5P is a short cylindrical sleeve.

Figure 7:
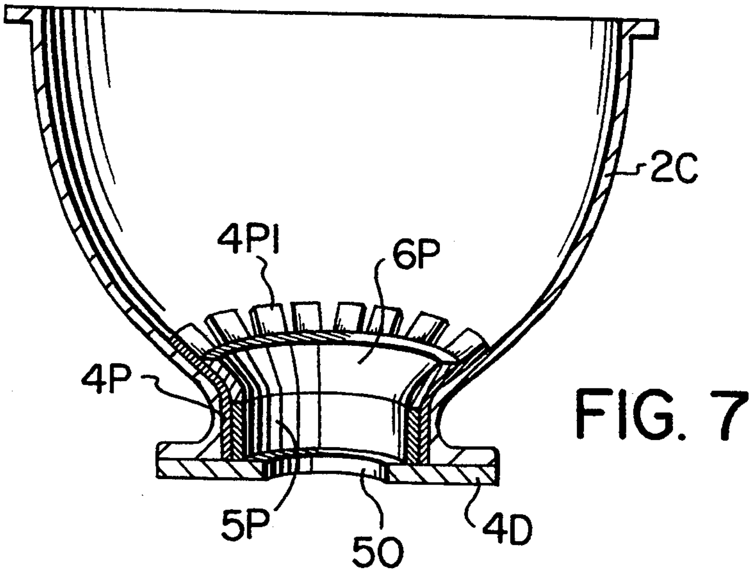

FIG. 7 illustrates a third piece 6P stacked on top of piece 5P and overlying part of the finger portion 4P1 of element 4P. Piece 6P is of truncated conical form.

Figure 8:
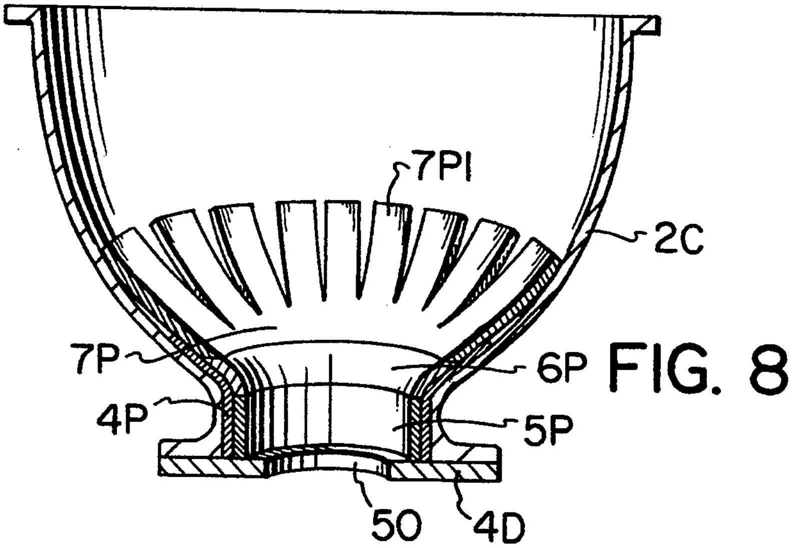

FIG. 8 illustrates a further portion of felt 7P stacked upon portion 6P and overlying and extending beyond the fingers 4P1 of piece 4P. Piece 6P is of truncated conical form with slits from one end providing at that end finger pieces 7P1.

Figure 9:
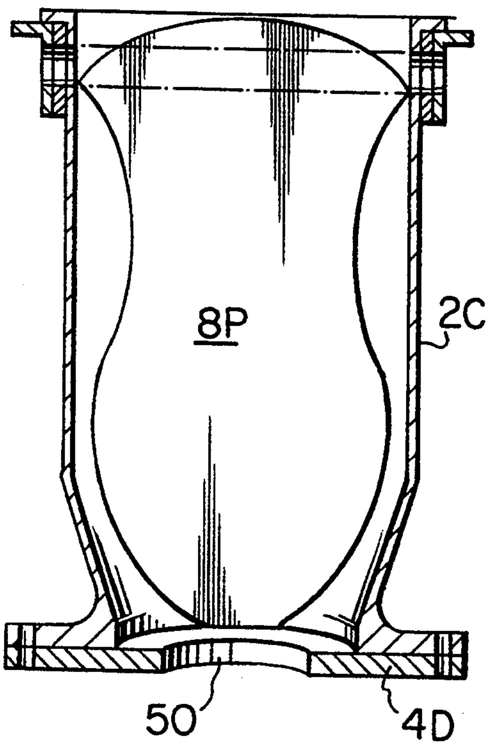
FIGS. 9 and 10 are partial sectional views taken at right angles to the section of FIG. 3 illustrating further pieces of filler material in the head housing.
Figure 10:
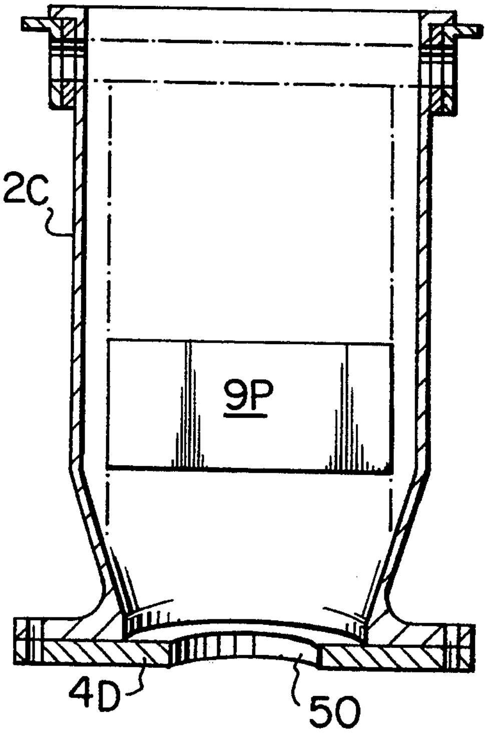

FIGS. 9 and 10 are sections taken at right angles to the sections of FIGS. 5 to 8. FIG. 9 illustrates one of a pair of pieces 8P that fit within the housing and FIG. 10 illustrates a piece of felt 9P overlying the piece of felt 8P at a selected area thereof.

Figure 11:
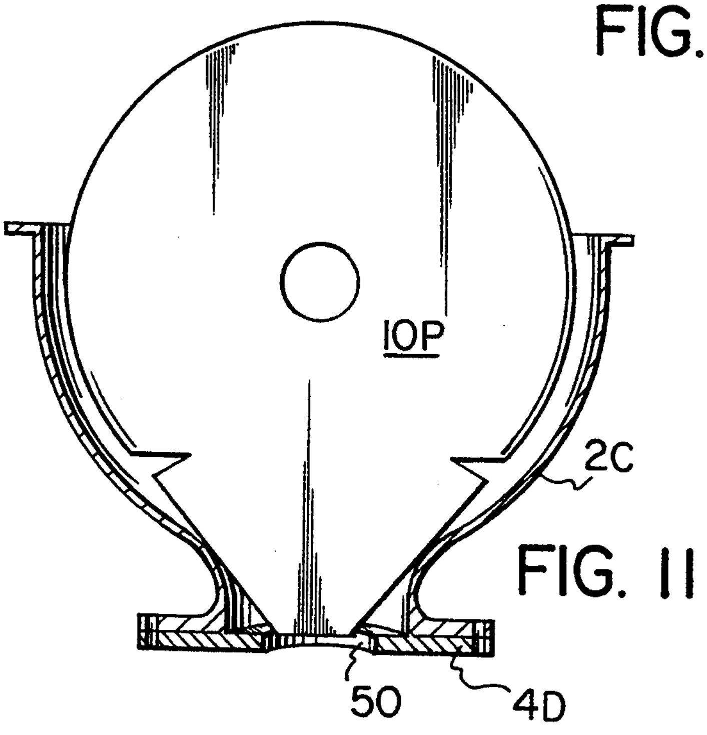
FIG. 11 is a partial sectional view in the same plane as FIG. 3 illustrating the final piece of filler material.

FIG. 11 illustrates one of a pair of felt pieces 10P that extend upwardly into the head housing overlying the major wall portion thereof. The build-up of felt pieces in the neck area of the head housing reduces the quantity of oil in that area and thereby minimizes the adverse effect should an explosion occur.

We claim:

1. An explosion resistant current transformer comprising:

(a) a metal housing having an internal chamber portion;

(b) a porcelain sleeve insulator having an internal chamber portion;

(c) an insulated electrical active component;

(d) means interconnecting said housing and insulator and having their respective chamber portions in communication with one another, said chamber portions together defining an enclosure, said electrical active component being located in said enclosure with spaces occurring that receive therein a liquid dielectric; and (e) shock wave absorbing means spaced from said electrical active component and having a compressible portion located at least partially in said chamber, said shock wave absorbing means being disposed at a position in proximity of the juncture of said metal housing and said insulator to reduce the force of a shock wave, resulting from an explosion within the metal housing, before arriving at the insulator and means anchoring said shock absorbing means to a rigid structure provided by said metal housing and porcelain sleeve.

2. An explosion resistant device as defined in claim 1 wherein said insulator provides a mounting for said metal housing.

3. An explosion resistant current transformer as defined in claim 1 including selected and predetermined areas of weakness in the wall of said metal housing for rupture to occur at said predetermined area when an explosion occurs.

4. An explosion resistant current transformer comprising:

(a) a metal housing an internal chamber portion;

(b) a porcelain sleeve insulator having an internal chamber portion;

(c) an insulated electrical active component;

(d) means interconnecting said housing and insulator and having their respective chamber portions in communication with one another, said chamber portions together defining an enclosure, said electrical active component being located in said enclosure with spaces occurring that receive therein a liquid dielectric; and (e) shock wave absorbing means located at least partially in said chamber and at a position in the proximity of the juncture of said metal housing and said insulator to reduce the force of a shock wave, resulting from an explosion within the metal housing, before arriving at the insulator and wherein said shock wave absorbing means is mounted on said metal housing and insulator structure, said shock absorbing means having a portion thereof projecting inwardly into said enclosure and terminating in close proximity to but spaced a selected distance from said active component, said inwardly projecting portion having a sealed air chamber therein for absorbing shock waves that may be transmitted through said liquid dielectric.

5. An explosion resistant current transformer comprising:

(a) a metal housing having an internal chamber portion;

(b) a porcelain sleeve insulator having an internal chamber portion;

(c) an insulated electrical active component;

(d) means interconnecting said housing and insulator and having their respective chamber portions in communication with one another, said chambers portions together defining an enclosure, said electrical active component being located in said enclosure with spaces occurring that receive therein a liquid dielectric; and (e) shock wave absorbing means located at least partially in said chamber and at a position in the proximity of the juncture of said metal housing and said insulator to reduce the force of a shock wave, resulting from an explosion within the metal housing, before arriving at the insulator and wherein said shock wave absorbing means comprises a shock wave attenuator that includes a pair of annular flanges having resiliently flexible material sandwiched therebetween and wherein said shock wave attenuator is sandwiched between said metal housing and insulator at the juncture thereof.

6. An explosion resistant current transformer as defined in claim 1 including a predetermined arrangement of grooves in the wall of the metal housing which define an area of predetermined weakness for rupture to occur in the event of an explosion.

7. An explosion resistant current transformer as defined in claim 6 wherein said arrangement of grooves is located in proximity of where such housing is joined to the insulator.

8. An explosion resistant current transformer comprising:

(a) a metal housing having an internal chamber portion;

(b) a porcelain sleeve insulator having an internal chamber portion;

(c) an insulated electrical active component;

(d) means interconnecting said housing and insulator and having their respective chamber portions in communication with one another, said chamber portions together defining an enclosure, said electrical active component being located in said enclosure with spaces occurring that receive therein a liquid dielectric; and (e) shock wave absorbing means located at least partially in said chamber and at a position in the proximity of the juncture of said metal housing and said insulator to reduce the force of a shock wave, resulting from an explosion within the metal housing, before arriving at the insulator and wherein said shock wave absorbing means comprises a shock wave attenuator having a sealed annular air chamber projecting into said enclosure and including means anchoring said attenuator to a rigid structure provided by said metal housing and porcelain insulator.

9. An explosion resistant current transformer comprising:

(a) a metal housing having an internal chamber portion;

(b) a porcelain sleeve insulator having an internal chamber portion;

(c) an insulated electrical active component;

(d) means interconnecting said housing and insulator and having their respective chamber portions in communication with one another, said chamber portions together defining an enclosure, said electrical active component being located in said enclosure with spaces occurring that receive therein a liquid dielectric; and (e) shock wave absorbing means located at least partially in said chamber and at a position in the proximity of the juncture of said metal housing and said insulator to reduce the force of a shock wave, resulting from an explosion within the metal housing, before arriving at the insulator, said transformer including an inert filler material in said metal housing at a location adjacent the said junction of said metal housing, with said porcelain insulator and wherein said filler material comprises pieces of felt.

10. An explosion resistant current transformer as defined in claim 9 wherein said filler comprises a plurality of pieces of felt layered upon one another in overlapping relation.

11. An improvement in current transformers having a conventional, insulated, electrical active component in an enclosure defined by a metal shell head housing and a porcelain sleeve insulator in which said head housing is mounted on said insulator, said insulated electrical component being spaced from the walls defining the inside of said enclosure and wherein between said insulated electrical component and said walls, there is a liquid dielectric, said improvement comprising a shock wave attenuator comprising an annular member having an outer portion thereof sandwiched between said metal housing and said insulator and a further inner portion comprising a compressible shock absorber means projecting inwardly into said enclosure towards said active component and terminating at a position in proximity of said electrical active component but spaced therefrom.

12. The improvement of claim 11 wherein said further portion of said shock wave attenuator is spaced a selected distance from said active component.

13. An improvement in current transformers having a conventional, insulated, electrical active component in an enclosure defined by a metal shell head housing and a porcelain sleeve insulator, said insulated electrical component being spaced from the walls defining the inside of said enclosure and including a liquid dielectric in said enclosure, said improvement comprising a shock wave attenuator having a portion thereof sandwiched between said metal housing and said insulator and a further portion projecting inwardly into said enclosure towards said active component, said further portion of said shock wave attenuator including a sealed air chamber therein circumscribing said electrical component at a location in proximity of the junction of said metal shell head housing and said porcelain insulator.

14. The improvement of claim 13 including discrete pieces of filler material in said enclosure at a location in proximity of the juncture of the head housing with the insulator so as to reduce the amount of liquid dielectric in such region.

15. The improvement as defined in claim 13 including a predetermined arrangement of grooves in a wall of said head housing and at a selected location therein so as to provide a predetermined area for the head housing to rupture in the event of an explosion.

16. An improvement in current transformers having a conventional, insulated, electrical active component in an enclosure defined by a metal shell head housing and a porcelain sleeve insulator in which said head housing is mounted on said insulator, said insulated electrical component being spaced from the walls defining the inside of said enclosure and wherein between said insulated, electrical component and said walls, there is a liquid dielectric, said improvement comprising a shock wave attenuator having a portion thereof sandwiched between said metal housing and said insulator and a further portion projecting inwardly into said enclosure towards said active component and terminating at a position in proximity of said electrical active component but spaced therefrom and discrete pieces of filler material in said enclosure at a location in proximity of the juncture of the head housing with the insulator so as to reduce the amount of liquid dielectric in such region and whereas said filler material comprises pieces of felt.

17. In a high voltage current transformer of the inverted type having and including a metal head housing mounted on and a top a porcelain sleeve insulator which together provide a chamber having therein an electric active part of the transformer immersed in a liquid dielectric the improvement comprising an energy absorbing shock wave attenuator disposed in proximity of the juncture between the porcelain insulator and the head housing, said attenuator having a compressible portion projecting into said chamber toward said electrical active part of the transformer and spaced a selected distance therefrom and means anchoring said attenuator to a rigid structure provided by said insulator and head housing.

18. A high voltage current transformer as defined in claim 17 wherein the predetermined area of weakness in the head housing is at a position in the vicinity of dielectrically the weakest point where arcing is most likely to take place when it occurs.

* * * * *